Dec. 20, 1955

F. M. RIDDLE 2,728,049

REACTIVE MODULATION CIRCUIT

Filed Aug. 23, 1954

INVENTOR.
FRED M. RIDDLE

BY Lyon & Lyon

ATTORNEYS

United States Patent Office 2,728,049

Patented Dec. 20, 1955

2,728,049

REACTIVE MODULATION CIRCUIT

Fred M. Riddle, La Canada, Calif., assignor to California Institute Research Foundation, Pasadena, Calif., a corporation of California Application August 23, 1954, Serial No. 451,580

4 Claims. (Cl. 332—16)

This invention relates to reactance-modulated oscillators and, more particularly, to an improvement in reactance-modulated oscillators.

A feature of this invention is the provision of a simple, novel, and useful reactance-modulated oscillator circuit.

A further feature of the present invention is the provision of a unique reactance-modulated oscillator circuit employing transistors.

Still another feature of the present invention is the provision of a simple transistor reactance-modulation circuit.

These and other objects of the invention are achieved in apparatus wherein there is provided a pair of input terminals across which a variable D. C. is applied. A diode is connected across these input terminals. A transistor has an input electrode and a common electrode connected between these two terminals. Also provided is an oscillator having a tuned load. The input and output electrodes of the transistor are connected into this tuned load. The application of different amounts of D. C. to the input terminals varies the amount of reactance current flowing in the tuned circuit and, thereby, enables the frequency of oscillation of the oscillator to be controlled. The oscillator may be any suitable type including a transistor oscillator.

The novel features that are considered characteristic of this invention are set forth with particularity in the appended claims. The invention itself, both as to its organization and method of operation, as well as additional objects and advantages thereof, will best be understood from the following description when read in connection with the accompanying drawings, in which:

Figure 1:
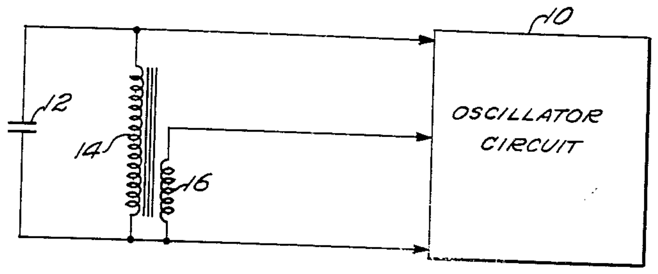
Figure 1 is a schematic diagram of the basic oscillator tuned circuit shown for the purposes of assisting in an explanation herein.
Figure 2:
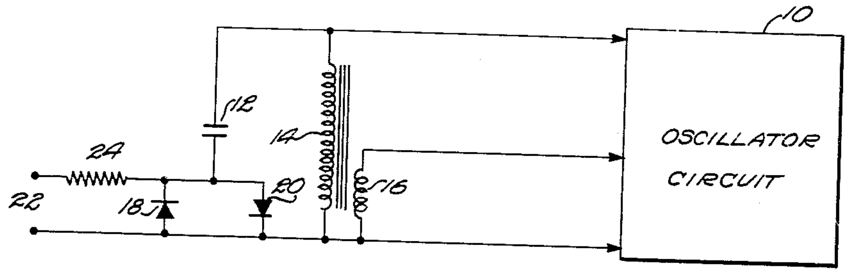
Figure 2 is an equivalent oscillator tuned circuit also shown for the purpose of assisting in the explanation.

Referring now to Figure 1, there is shown schematically an oscillator circuit 10 having a tuned load consisting of a parallel condenser 12 and inductance 14 with feedback through the inductively coupled inductance 16. The voltage across the tuned circuit is 90° out of phase with the circulating current in the tuned circuit. If a small resistance (not shown) that is about 1/100 of the impedance of the inductance 14 is inserted in series with the inductance, the tuned circuit Q will be lowered slightly but the oscillator operation will be substantially the same as previously.

Instead of inserting a resistance in series with the inductance in the tuned circuit in Figure 1, there are shown two diodes 18, 20, which are employed to obtain substantially similar effects. If a direct current is introduced to the input terminals 22, the operation of the oscillator will not be appreciably affected but the proportion of the A. C. current flowing in the tuned load that each diode conducts will be varied according to the magnitude and polarity of the input current. Input resistor 24 is used for the purposes of limiting the current and providing isolation. Accordingly, the effect of the two diodes is substantially the same as that of inserting the resistor in the tuned load: namely, lowering the Q. However, the extent of the conduction of each diode may be controlled simply by varying the D. C. applied to the terminals 22.

The input of a transistor in a grounded base connection is essentially substantially the same as that to a diode. Accordingly, if one of the diodes were to be replaced by the input connection to a grounded base transistor, then the operation of the circuit is unaltered as far as the effect on the oscillator is concerned and is substantially the same as employing two diodes.

Figure 3:
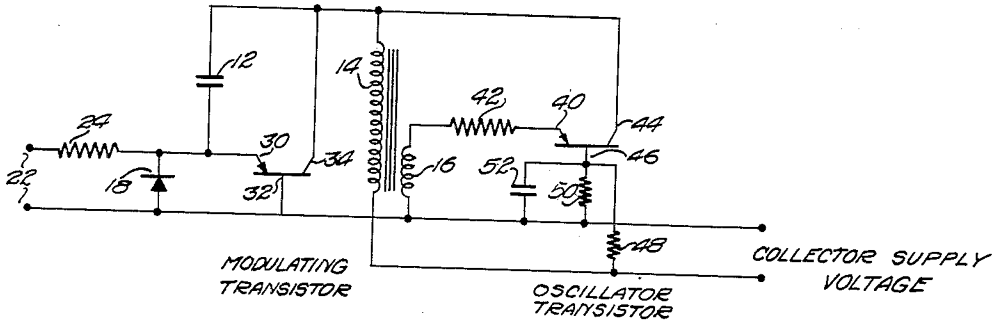
Figure 3 is a schematic diagram of the embodiment of the invention.

In Figure 3 a transistor is shown, preferably of the junction type, wherein the emitter 30 and base 32 are connected across the input terminals 22 in place of diode 20. Taking advantage of the power amplification of the transistor, the collector 34 is connected to one end of the inductance 14. Effectively, then, condenser 12 is connected between the input and output terminals of the transistor. The common terminal is connected to one of the input terminals and the inductance 14 is connected to the output terminal. With this connection, reactive current is added to the current in the tuned circuit. It is well known that the operating frequency of the conventional inductance capacitance oscillator can be altered by introducing an alternating current that is of the same frequency but 90° out of phase with the oscillator A. C. voltage. The frequency shifts of the oscillator due to this additional current is proportional to the amount of additional current introduced into the tuned circuit.

In the circuit shown in Figure 3, D. C. current is applied to terminals 22. This may be positive or negative, as desired, to effectuate control. With the circuit shown, it has been found that ±1.5 to 2 milliamperes of current is sufficient to obtain a frequency variation range of ±35 percent. When the D. C. current is applied, the collector 34 of the transistor is negative for a period of over 95 percent of the oscillation cycle. The current that flows in the collector will be the alpha or current gain of the transistor multiplied by the current that flows in the input diode. The current that flows in the transistor input diode will be the tuned circuit circulating current during a portion of the cycle, as controlled by the input current. Since the tuned circuit current is 90° out of phase from the tuned circuit voltage, the additional current flowing in the collector is a reactive current and will cause a frequency shift in the oscillator operating frequency.

The oscillator shown in Figure 3 is a transistor oscillator, although it will be appreciated that a vacuum tube oscillator may be used as well. The transistor oscillator consists of the emitter 40 which is connected in series with a limiting resistance 42 and the feedback inductance 16. The collector 44 is connected together with the collector 34 to one end of the inductance 14. The other end of the inductance 14 is connected to a collector supply voltage. The base 46 of the oscillating transistor is biased by means of two voltage-dropping resistors 48, 50, one of which is bypassed by capacitor 52. The bias is thus set at the proper value to enable oscillation. In utilizing the two transistors, the device is made extremely simple, light, and portable, and requires a minimum of power. The transistor is here employed as a time-controlled reactance modulator. The portion of the cycle during which reactive current flows in the tuned circuit can be controlled by the amplitude of the D. C. current introduced into control transistor and, thereby, the frequency output of the system is controlled.

There has been shown and described hereinabove a novel, useful, and simple reactance-controlled oscillator employing transistors. Although the embodiment of the invention has been described connecting the electrodes of the transistor in the fashion shown, it will be appreciated that other variations are possible in well-known manner, such as reversing the connections of the emitter and base, all of which are within the scope of the present invention.

I claim:

1. A modulator-oscillator circuit comprising a pair of input terminals, means to apply direct current to said input terminals, a diode connected across said input terminals, a transistor having an input electrode, an output electrode and a common electrode, means coupling said input electrode and said common electrode between said input terminals, an oscillator circuit including a tuned circuit, said tuned circuit including a condenser and an inductance, means coupling said condenser between said input and output electrode, and means coupling said inductance to said output electrode whereby the frequency of said oscillator may be controlled responsive to the application of said direct current by said means.

2. A reactance modulator-oscillator circuit comprising a pair of input terminals, means to apply direct current to said input terminals, a diode connected across said input terminals, a transistor having an emitter, a collector and a base, means coupling said emitter and said base between said input terminals, an oscillator circuit including a tuned circuit, said tuned circuit including a condenser and an inductance, means coupling said condenser between said emitter and said collector, and means coupling said inductance to said collector, whereby the frequency of said oscillator may be controlled responsive to the application of said direct current by said means.

3. A reactance modulator-oscillator circuit as recited in claim 2 wherein said oscillator circuit includes a second transistor and said tuned circuit is coupled as a tuned load to said second transistor.

4. A reactance modulator-oscillator circuit comprising a pair of input terminals, a diode connected across said input terminal, a first transistor having an emitter, a collector and a base, means coupling said emitter and said base between said input terminals, a tuned circuit including a condenser and a first inductance, said condenser being coupled between said emitter and said collector, a source of operating potential, said inductance being coupled between said collector and said source of operating potential, a second transistor having an emitter, collector, and base, means coupling the collector of said second transistor to the collector of said first transistor, a second inductance inductively coupled to said first inductance, and means to apply a bias to the base of said second transistor to enable oscillation whereby the frequency of oscillation may be controlled by applying direct current to said input terminals.

References Cited in the file of this patent

UNITED STATES PATENTS

| | | |
|---|---|---|
| 2,476,959 | Chatterjea et al. | July 26, 1949 |
| 2,570,939 | Goodrich | Oct. 9, 1951 |